United States Patent
Bean, Jr. et al.

(10) Patent No.: US 8,973,380 B2
(45) Date of Patent: Mar. 10, 2015

(54) SYSTEMS AND METHODS FOR DETECTING REFRIGERANT LEAKS IN COOLING SYSTEMS

(75) Inventors: John H. Bean, Jr., Wentzville, MO (US); James Richard Roesch, St. Charles, MO (US)

(73) Assignee: Schneider Electric IT Corporation, West Kingston, RI (US)

( * ) Notice: Subject to any disclaimer, the term of this patent is extended or adjusted under 35 U.S.C. 154(b) by 1072 days.

(21) Appl. No.: 12/474,100

(22) Filed: May 28, 2009

(65) Prior Publication Data

US 2010/0300129 A1 Dec. 2, 2010

(51) Int. Cl.
*F25B 45/00* (2006.01)
*H05K 7/20* (2006.01)
*F25B 49/00* (2006.01)

(52) U.S. Cl.
CPC .......... *H05K 7/20827* (2013.01); *F25B 49/005* (2013.01); *F25B 2500/222* (2013.01); *F25B 2700/04* (2013.01)
USPC .................. 62/149; 62/157; 62/509

(58) Field of Classification Search
USPC ........... 62/127, 129, 149, 157, 158, 174, 190, 62/292, 498, 503, 509
See application file for complete search history.

(56) References Cited

U.S. PATENT DOCUMENTS

| | | | | |
|---|---|---|---|---|
| 4,220,010 A | * | 9/1980 | Mueller et al. | 62/126 |
| 4,581,900 A | * | 4/1986 | Lowe et al. | 62/228.1 |
| 5,009,076 A | * | 4/1991 | Winslow | 62/129 |
| 5,214,918 A | * | 6/1993 | Oguni et al. | 62/56 |
| 5,398,516 A | * | 3/1995 | Kuribara et al. | 62/129 |
| 6,430,944 B1 | * | 8/2002 | Ozawa | 62/115 |
| 6,571,566 B1 | * | 6/2003 | Temple et al. | 62/129 |
| 6,745,590 B1 | | 6/2004 | Johnson et al. | |
| 6,959,558 B2 | | 11/2005 | Bean, Jr. et al. | |
| 6,967,283 B2 | | 11/2005 | Rasmussen et al. | |
| 7,046,514 B2 | | 5/2006 | Fink et al. | |
| 7,165,412 B1 | | 1/2007 | Bean, Jr. | |
| 7,173,820 B2 | | 2/2007 | Fink et al. | |
| 7,293,666 B2 | | 11/2007 | Mattlin et al. | |

(Continued)

FOREIGN PATENT DOCUMENTS

| | | |
|---|---|---|
| EP | 1970651 A1 | 9/2008 |
| GB | 2260816 A | 4/1993 |
| WO | 2007022779 A1 | 3/2007 |

OTHER PUBLICATIONS

International Search Report for PCT/US2010/035415 mailed Sep. 2, 2010.

*Primary Examiner* — Jonathan Bradford
(74) *Attorney, Agent, or Firm* — Lando & Anastasi, LLP

(57) ABSTRACT

A method of detecting loss of refrigerant within a cooling system of the type having a condenser, a refrigerant receiver in fluid communication with the condenser, a sensor configured to detect a level of refrigerant within the receiver, an evaporator in fluid communication with the receiver, and a pump or compressor in fluid communication with the evaporator and the condenser, includes establishing a baseline measurement of refrigerant mass contained in the receiver with the sensor during certain power loads applied to the cooling system, monitoring a mass of refrigerant in the receiver with the sensor at a certain power load applied to the cooling system, and identifying whether the monitored mass of refrigerant is less than the baseline measurement of refrigerant mass over a predetermined period of time. Systems for detecting loss of refrigerant are further disclosed.

20 Claims, 7 Drawing Sheets

(56) References Cited

U.S. PATENT DOCUMENTS

| | | |
|---|---|---|
| 7,325,410 B1 | 2/2008 | Bean, Jr. |
| 7,365,973 B2 | 4/2008 | Rasmussen et al. |
| 7,406,839 B2 | 8/2008 | Bean et al. |
| 7,418,825 B1 | 9/2008 | Bean, Jr. |
| 7,529,086 B2 | 5/2009 | Fink et al. |
| 7,603,874 B2 | 10/2009 | Fink et al. |
| 7,681,404 B2 | 3/2010 | Bean, Jr. |
| 7,681,410 B1 | 3/2010 | Bean, Jr. |
| 7,684,193 B2 | 3/2010 | Fink et al. |
| 7,775,055 B2 | 8/2010 | Bean et al. |
| 2006/0179854 A1 | 8/2006 | Esslinger |
| 2006/0196224 A1* | 9/2006 | Esslinger ................. 62/509 |
| 2007/0074537 A1 | 4/2007 | Bean et al. |
| 2007/0089440 A1* | 4/2007 | Singh et al. ................. 62/129 |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2008/0041076 A1 | 2/2008 | Tutunoglu et al. |
| 2008/0041077 A1 | 2/2008 | Tutunoglu |
| 2008/0141703 A1 | 6/2008 | Bean, Jr. |
| 2008/0142068 A1 | 6/2008 | Bean et al. |
| 2008/0198549 A1 | 8/2008 | Rasmussen et al. |
| 2008/0245083 A1 | 10/2008 | Tutunoglu et al. |
| 2009/0007591 A1 | 1/2009 | Bean et al. |
| 2009/0019875 A1 | 1/2009 | Fink et al. |
| 2009/0080173 A1 | 3/2009 | Porter et al. |
| 2009/0195977 A1 | 8/2009 | Fink et al. |
| 2009/0223240 A1 | 9/2009 | Bean, Jr. |
| 2009/0259343 A1 | 10/2009 | Rasmussen et al. |
| 2010/0061057 A1 | 3/2010 | Dersch et al. |
| 2010/0154438 A1 | 6/2010 | Bean, Jr. |
| 2010/0165572 A1 | 7/2010 | Fink et al. |
| 2010/0170663 A1 | 7/2010 | Bean, Jr. |
| 2010/0186517 A1 | 7/2010 | Bean, Jr. |
| 2010/0188816 A1 | 7/2010 | Bean, Jr. et al. |

* cited by examiner

SYSTEMS AND METHODS FOR DETECTING REFRIGERANT LEAKS IN COOLING SYSTEMS

BACKGROUND OF DISCLOSURE

1. Field of Disclosure

Embodiments of the disclosure relate generally to cooling systems, such as cooling systems used to treat air within a data center, equipment room or wiring closet, and more specifically to systems and methods for detecting refrigerant leaks within cooling systems.

2. Discussion of Related Art

Equipment enclosures or racks for housing electronic equipment, such as data processing, networking and telecommunications equipment, have been used for many years. Such racks are often used to contain and to arrange the equipment in large equipment rooms and data centers. Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep, and is commonly referred to as a "nineteen inch" rack, as defined by the Electronics Industries Association's EIA-310-D standard.

Management systems have been developed to manage the power distribution and cooling systems of data centers containing racks. One such management system is known as the InfraStruXure™ ("ISX") manager offered by American Power Conversion Corporation of West Kingston, R.I., the assignee of the present disclosure, which is particularly designed to control the operation of large data centers.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by a data center's cooling system with computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

In other embodiments, the CRAC units may be modular and scalable so that the units may be placed anywhere within the data center depending on the cooling requirements within the data center. Such cooling units are described in pending U.S. patent application Ser. No. 11/335,874, entitled COOLING SYSTEM AND METHOD, filed on Jan. 19, 2006.

One disadvantage associated with known cooling units is that it is impossible or nearly impossible to detect a loss of refrigerant within the cooling units or within the cooling system in general. Further, no systems are known in which the operator of the data center may be warned of such a loss of refrigerant.

SUMMARY OF DISCLOSURE

An aspect of the present disclosure is directed to a method of detecting loss of refrigerant within a cooling system of the type having a condenser, a refrigerant receiver in fluid communication with the condenser, a sensor configured to detect a level of refrigerant within the receiver, an evaporator in fluid communication with the receiver, and a pump or compressor in fluid communication with the evaporator and the condenser. In one embodiment, the method comprises: establishing a baseline measurement of refrigerant mass contained in the receiver with the sensor during certain power loads applied to the cooling system; monitoring a mass of refrigerant in the receiver with the sensor at a certain power load applied to the cooling system; and identifying whether the monitored mass of refrigerant is less than the baseline measurement of refrigerant mass over a predetermined period of time.

Embodiments of the method of detecting loss of refrigerant may include, when establishing the baseline measurement of refrigerant mass, initiating a startup of the cooling system and applying a constant load on the cooling system. Establishing the baseline measurement of refrigerant mass may further include obtaining data from the sensor to determine a volume of refrigerant in the receiver, and wherein the mass of refrigerant within the receiver is calculated by using the volume of refrigerant in the receiver. Monitoring the mass of refrigerant in the receiver may include continuously obtaining data from the sensor in the receiver to determine a volume of refrigerant in the receiver. The method may further comprise generating an alarm when the monitored mass of refrigerant at a certain power load is less than the baseline measurement of refrigerant mass during certain power loads over the predetermined period of time. The method may be continuously repeated after predetermined time intervals.

Another aspect of the disclosure is directed to a system of detecting loss of refrigerant within a cooling system of the type having a condenser, a refrigerant receiver in fluid communication with the condenser, a sensor configured to detect a level of refrigerant within the receiver, an evaporator in fluid communication with the receiver, and a pump or compressor in fluid communication with the evaporator and the condenser. The system comprises a controller configured to establish a baseline measurement of refrigerant mass contained in the receiver with the sensor during certain power loads applied to the cooling system, monitor a mass of refrigerant in the receiver with the sensor at a certain power load applied to the cooling system, and identify whether the monitored mass of refrigerant is less than the baseline measurement of refrigerant mass over a predetermined period of time.

Embodiments of the system may include configuring the controller, when establishing the baseline measurement of refrigerant mass, to initiate a startup of the cooling system and apply a constant load on the cooling system. The controller, when establishing the baseline measurement of refrigerant mass, may be configured to obtain data from the sensor in the receiver to determine a volume of refrigerant in the receiver. The mass of refrigerant within the receiver is calculated by using the volume of refrigerant in the receiver. The controller, when monitoring the mass of refrigerant in the receiver, may be configured to identify a level of refrigerant in the receiver and/or continuously obtain data for a volume of refrigerant in the receiver. The system may further comprise an alarm coupled to the controller. The alarm is triggered when the monitored mass of refrigerant at a certain power load is less than the baseline measurement of refrigerant mass during certain power loads over the predetermined period of time.

A further aspect of the disclosure is directed to a cooling system comprising a condenser, a refrigerant receiver in fluid communication with the condenser, a sensor configured to detect a level of refrigerant within the receiver, an evaporator in fluid communication with the receiver, a pump or compressor in fluid communication with the evaporator and the condenser; and a controller. The controller is configured to establish a baseline measurement of refrigerant mass contained in the receiver with the sensor during certain power loads applied to the cooling system, monitor a mass of refrigerant in the receiver with the sensor at a certain power load applied to the cooling system, and identify whether the monitored mass of refrigerant is less than the baseline measurement of refrigerant mass over a predetermined period of time.

Embodiments of the cooling system may include configuring the controller, when establishing the baseline measurement of refrigerant mass, to initiate a startup of the cooling system and apply a constant load on the cooling system. The controller, when establishing the baseline measurement of refrigerant mass, may be configured to obtain data from the sensor in the receiver to determine a volume of refrigerant in the receiver. The mass of refrigerant within the receiver is calculated by using the volume of refrigerant in the receiver. The controller, when monitoring the mass of refrigerant in the receiver, may be configured to identify a level of refrigerant in the receiver and/or continuously obtain data for a volume of the amount of refrigerant in the receiver. The cooling system may further comprise an alarm coupled to the controller. The alarm is triggered when the monitored mass of refrigerant at a certain power load is less than the baseline measurement of refrigerant mass during certain power loads over the predetermined period of time.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
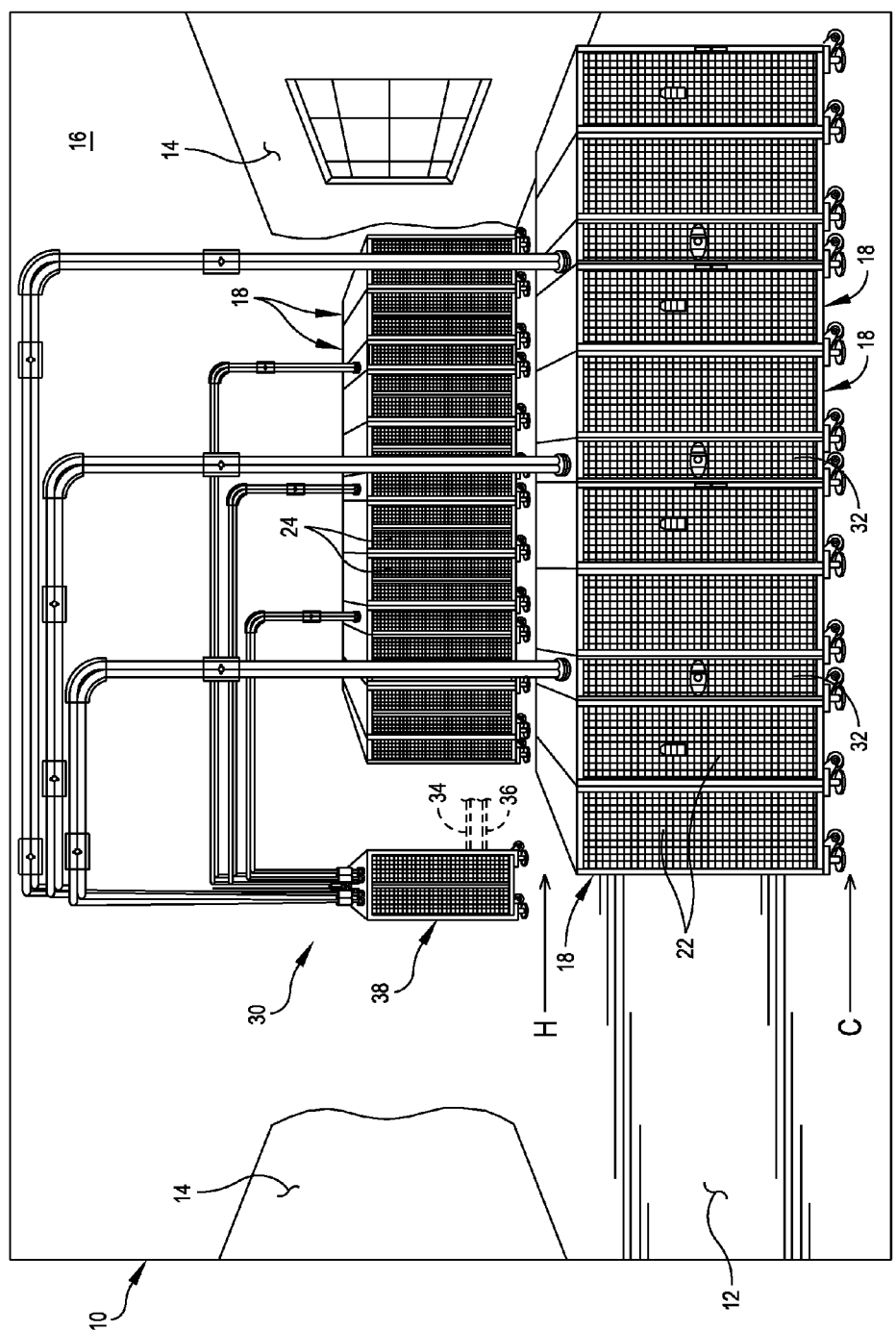
FIG. 1 is a perspective view of a portion of a data center incorporating a cooling system.

This disclosure is not limited in its application to the details of construction and the arrangement of components set forth in the following description or illustrated in the drawings. The concepts described in this disclosure are capable of other embodiments and of being practiced or of being carried out in various ways. Also, the phraseology and terminology used herein is for the purpose of description and should not be regarded as limiting. The use of "including," "comprising," "having," "containing," "involving", and variations thereof herein, is meant to encompass the items listed thereafter and equivalents thereof as well as additional items.

At least one embodiment of the present disclosure is directed for use with a cooling system that is configurable to cool electronic equipment housed within equipment enclosures or racks of a data center. As used herein, "enclosures" and "racks" are used to describe apparatus designed to support electronic equipment. Such a cooling system may embody one or more cooling units on an as needed basis to provide localized cooling within the data center. In one embodiment, multiple cooling units may be interspersed in a row of equipment racks to more efficiently cool the data center. In another embodiment, a hot aisle containment system may be employed to capture and treat hot air contained within the hot aisle. With each approach, the circulation path of warm air generated by the electronic equipment is reduced so as to reduce the mixing of hot and cold air within the data center.

Data centers are typically large rooms designed, in certain instances, to house hundreds of electronic equipment racks arranged in rows within the data center. The rows of equipment racks are arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. At least one embodiment of the cooling system is modular and scalable, and may take the form of a kit designed to meet these changing needs. Also, although relatively large data centers are discussed as an intended use for such a cooling system, as mentioned above, the system is scalable and may be employed in smaller rooms on a smaller scale and for applications other than data center.

In one embodiment, the cooling system may include a plurality of cooling units, each cooling unit having a housing adapted to support components of the cooling system. For example, the components of the cooling unit may include at least one heat exchanger coupled to a conduit system configured to deliver refrigerant to the heat exchanger. Fans may be provided to move air across the heat exchanger. Such a cooling unit may be referred to as a pumped refrigerant cooling system or PRCS. The cooling unit may be disposed within a row of equipment racks or within a canopy structure enclosing the hot aisle, and configured to intake the hot air within the data center from a hot aisle, for example, to cool the air to slightly below ambient temperature. This configuration eliminates the inefficiency of mixing hot air with the room temperature air to obtain a warm air mixture. This configuration may also decrease the latent cooling provided by the data center's air conditioning system thereby decreasing the need for humidification.

A typical data center includes a room designed to house a plurality of equipment racks. In one embodiment, each equipment rack may be constructed in accordance with the teachings disclosed in U.S. patent application Ser. No. 10/990,927, entitled EQUIPMENT ENCLOSURE KIT AND ASSEMBLY METHOD, filed on Nov. 17, 2004, which is owned by the assignee of the present disclosure and is incorporated herein by reference. Further, cabling between the equipment racks may be implemented by using cable distribution troughs contained on the roofs of the racks as disclosed in U.S. Pat. No. 6,967,283, which is incorporated herein by reference and assigned to the assignee of the present disclosure.

Specifically, the equipment rack includes a frame or housing adapted to support electronic components, such as data processing, networking and telecommunications equipment. A front of each equipment rack may include a front door so as to enable access into the interior of the equipment rack. Sides of each equipment rack may include at least one panel configured to cover a side to enclose the interior region of the rack. A back of each equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. Otherwise, the panels may be fabricated from solid material.

The equipment racks are modular in construction and configured to be rolled into and out of position, e.g., within a row of the data center. Casters are secured to a bottom of each equipment rack to enable the rack to roll along the floor of the data center. Once positioned, leveling feet may be deployed to securely ground the equipment rack in place within the row. An example of casters and leveling feet employed on such an equipment rack is disclosed in detail in U.S. patent application Ser. No. 10/990,927.

Electronic equipment may be positioned in the interior region of the equipment rack. For example, the equipment may be placed on shelving secured within the interior region of the equipment rack either prior to or after positioning the equipment rack within the data center. Cables providing electrical and data communication may be provided through the top of the equipment rack through a cover (or "roof" as described in U.S. Pat. No. 6,967,283) provided at the top of the equipment rack. The cover has openings formed therein to receive the cables, or the top of the equipment rack may be left open so that the cables run directly into the equipment rack through the open top. In this embodiment, the cables may be strung along the roofs of the rack or may be provided in the aforementioned cable distribution trough. In another embodiment, the cables may be disposed within a raised floor and connected to the electronic equipment through the bottom of the equipment rack. With both configurations, power and communication lines are provided to the equipment racks.

As discussed above, data centers are typically configured with rows of equipment racks arranged such that cool air is drawn into the racks from a cool aisle and warm or hot air is exhausted from the racks into a hot aisle. The equipment racks may be arranged in two rows with the fronts of the equipment racks in a near row being arranged in a forward direction and the backs of the equipment racks in a far row being arranged in a rearward direction. However, as stated above, in a typical data center, there are multiple rows of equipment racks wherein the rows may be arranged with the fronts of the equipment racks facing one another to define the cold aisle and with the backs of the equipment racks facing one another to define the hot aisle.

In order to address the heat build-up and hot spots within the data center, a plurality of cooling units may be provided. In one embodiment, the arrangement may be such that there is a cooling unit for every two equipment racks provided in the data center. However, more or less cooling units may be provided based on environmental conditions of the data center. Further in some embodiments, the concentration and locations of cooling units may be adjusted based on the locations of the hottest racks in the data center, or based on information obtained and analyzed by a data center information management system. Additionally, cooling units of embodiments of the disclosure may be used in combination with other types of cooling systems, such as cooling systems of the types disclosed in U.S. patent application Ser. Nos. 11/335,874, 11/335,856 and 11/335,901, each entitled COOLING SYSTEM AND METHOD and filed on Feb. 10, 2006, which are owned by the assignee of the present disclosure and incorporated herein by reference.

In one embodiment, the controller is adapted to control the operation of the cooling system based on environmental parameters obtained by the controller. Generally speaking, with prior cooling systems, the individual cooling units can not communicate with one another. However, with cooling systems of the embodiments disclosed herein, the controller may embody a plurality of controllers provided in the cooling units that communicate with one another over a controller area network (CAN) Bus. In other embodiments, a master controller may be provided to control the operation of the controllers of the cooling units. Each cooling unit may be provided with a display, which is operably coupled to the controller. The display is adapted to display the environmental conditions of the data center, such as, and not limited to, the temperature and the humidity of the data center at the cooling unit, the temperature of the air entering into and exiting out of the cooling unit, the temperature of refrigerant entering into and exiting out of the cooling unit, the flow rate of refrigerant entering the cooling unit, and the cooling capacity of the cooling unit. Suitable monitors, sensors and/or gauges may be provided to acquire such information. Alternatively, or in addition to the foregoing embodiment, the environmental conditions may be displayed on a unit provided with an integrated data center control and monitoring system.

In certain circumstances, it may be desirable to control the air flow within the hot and cold aisles, and in the hot aisles in particular. Typically, heat generated from electronic components housed within the equipment racks is exhausted out of the backs of the equipment racks into the hot aisles. It may be further desirable to contain the hot air for conditioning by the cooling unit, such as the modular cooling unit described above. It is known to enclose the hot aisle with a ceiling assembly that is designed for the particular equipment rack configuration. Such known ceiling assemblies are typically installed when installing the equipment racks in the data center and are manufactured by the manufacturers of the equipment racks.

Turning now to the drawings, and more particularly to FIG. 1, there is shown a portion of a typical data center, generally indicated at 10. As shown, the data center 10 includes a room defined by a floor 12, walls, each indicated at 14, and a ceiling 16. The data center 10 is designed to house a plurality of equipment racks, each generally indicated at 18. Further, although not shown specifically in FIG. 1, cabling between the equipment racks 18 may be implemented using cable distribution troughs contained on the roofs of the racks as described above.

Data centers 10 are typically configured with rows of equipment racks 18 arranged such that cool air is drawn into the racks from a cool aisle C and warm or hot air is exhausted from the racks into a hot aisle H. For illustration purposes only, the equipment racks 18 are arranged in FIG. 1 in two rows with the fronts 22 of the equipment racks in the near row being arranged in a forward direction as viewed in FIG. 1 and the backs 24 of the equipment racks in the far row being arranged in a rearward direction as viewed in FIG. 1.

In order to address the heat build-up and hot spots within the data center 10, and to address climate control issues within the data center in general, a cooling system, which is generally indicated at 30, is provided. As shown in FIG. 1, the cooling system 30 includes a plurality of cooling modules, each generally indicated at 32, disposed within the data center 10. The data center 10 preferably has an inlet and an outlet adapted to deliver and return coolant (e.g., water or a water/glycol solution) from a suitable source, such as a chiller unit. Specifically, the inlet is adapted to deliver chilled coolant to the data center 10 by a supply line 34, whereas the outlet is adapted to exhaust heated coolant from the data center by a return line 36. The supply and return lines 34, 36 are in fluid communication with a manifold or distribution unit, which is generally indicated at 38. The distribution unit 38 includes an enclosure positioned in the data center 10, and is designed to distribute chilled refrigerant (e.g., R-134a, $CO_2$, R-407c or R-410a) to and to accept heated refrigerant from each cooling module 32 by overhead piping, for example. In one embodiment, the distribution unit 38 functions as a heat exchanger to cool heated refrigerant returned from the cooling modules 32 and to distribute cooled refrigerant back to cooling modules. Coolant from the chiller unit achieves this heat transfer.

It should be observed that the distribution unit 38 may, in certain embodiments, be conveniently provided within the data center 10. For example, the distribution unit 38 may be attached to a wall 14 or other surface (e.g., the ceiling 16) inside or outside the data center 10. The provision of a movable distribution unit 38 enables the cooling system 30 of the present disclosure to better accommodate rooms of various shapes and sizes as well as rooms requiring varying cooling needs. In addition, it should be noted that more than one distribution unit 38 may be provided in large data rooms to accommodate many cooling modules 32, for example, or in circumstances requiring excessive cooling. In certain embodiments, and with reference to FIG. 2, the distribution unit 38 includes a condenser 26 and a receiver 28 in fluid communication with an outlet of the condenser. The condenser 26 is part of the refrigerant loop provided between the distribution unit 38 and the cooling modules 32. The receiver 28 is configured to contain liquid refrigerant exiting the condenser 26. As will be discussed in greater detail below, a sensor may be provided within the receiver 28 to obtain a level measurement of refrigerant within the receiver.

Figure 2:
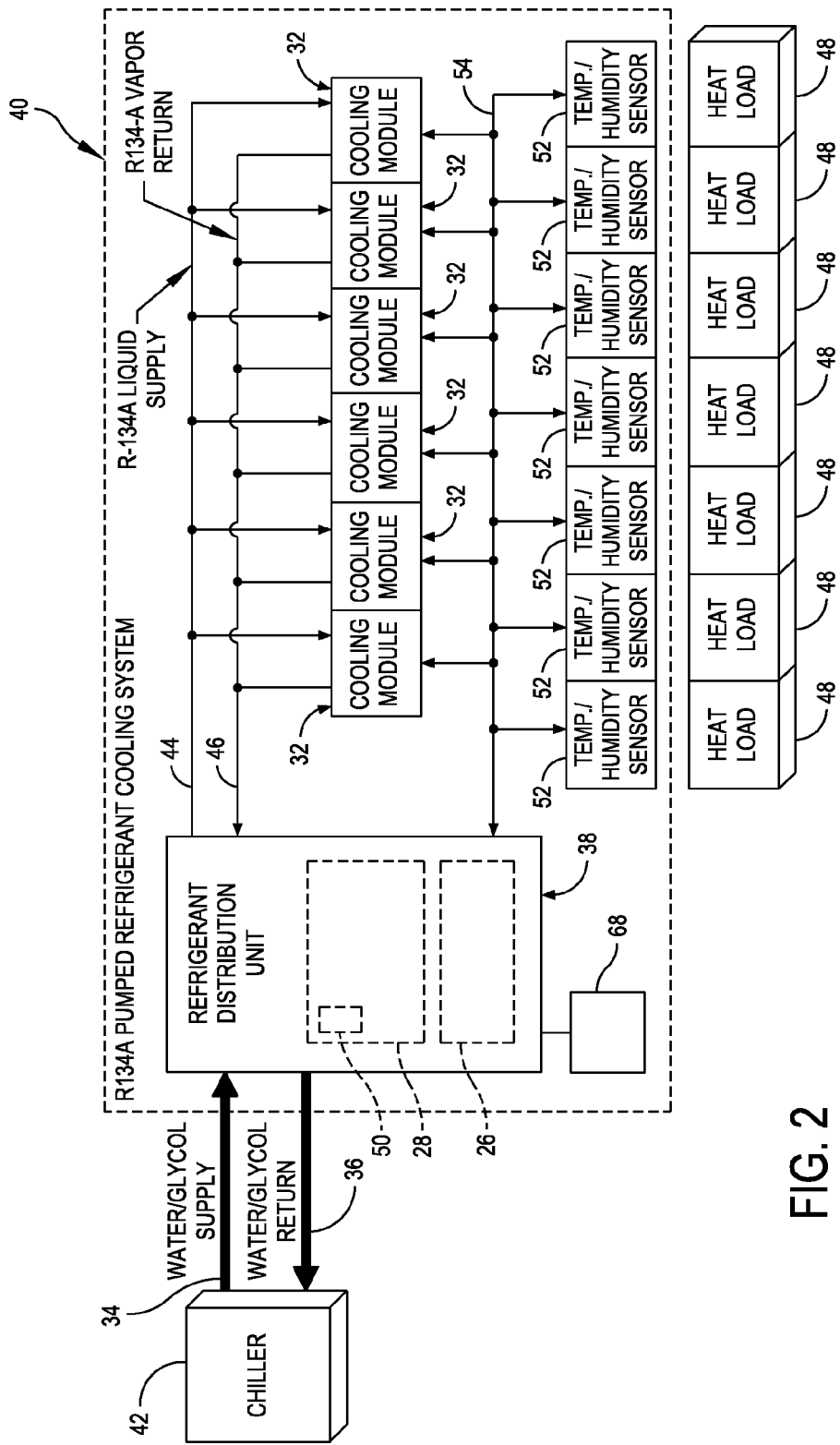
FIG. 2 is a block diagram of a cooling system of an embodiment of the disclosure.

Turning now to FIG. 2, a schematic of an exemplary pumped refrigerant cooling system or PRCS 40 is shown and described below. To the extent that the pumped refrigerant cooling system 40 incorporates similar or identical components used in the cooling system 30 described in FIG. 1, like reference numbers are used to designate such similar or identical components. The pumped refrigerant cooling system 40 is connected to a source of chilled coolant 42 by the supply line 34. Heated coolant is returned to the source 42 from the pumped refrigerant cooling system 40 by the return line 36. The system 40 includes the refrigerant distribution unit 38, which is configured to pump liquid refrigerant (e.g., R-134a, $CO_2$, R-407c or R-410a) by a liquid refrigerant supply line 44 to several cooling modules 32. Although six cooling modules 32 are illustrated in FIG. 2, it should be understood that any number of cooling modules may be provided as part of pumped refrigerant cooling system 40 or as part of a dedicated subsystem. Heated vapor refrigerant is returned to the distribution unit 38 from the cooling modules 32 by a vapor refrigerant return line 46. The heated refrigerant is cooled and condensed within the distribution unit 38 by the coolant provided by the chiller source 42.

The cooling modules 32 may be positioned above a hot aisle for a hot aisle containment system for a HACS configuration or alternately may be placed adjacent to the equipment racks 18 for either the HACS or HA/CA configurations in the manner described above. The cooling modules 32 are configured to receive chilled liquid refrigerant from the distribution unit 38 by the liquid refrigerant supply line 44 to transfer the heat from the loads (e.g., heat produced by the equipment racks), each indicated at 48, into the refrigerant by an evaporator (not shown in FIG. 2) provided within each cooling module. The operation of each cooling module 32 will be described in greater detail below with reference to FIG. 3. During this process, the refrigerant undergoes a phase change from a liquid to a vapor state. The vaporized refrigerant is returned to the distribution unit 38 by the vapor refrigerant return line 46. In one embodiment, a sensor 50 is disposed within the receiver 28 of the distribution unit 38 to measure the amount of refrigerant contained within the distribution unit. This information may be sent to a controller of the cooling system 40 or to a microprocessor associated with the distribution unit 38. In addition, as will be discussed in greater detail below, a sensor package of the cooling module includes sensors to measure the speed of the fans of the cooling module, to measure the supply and return air temperatures of the cooling module, and to measure the pressure of refrigerant entering into and exiting an evaporator of the cooling module, for example.

Still referring to FIG. 2, the pumped refrigerant cooling system 40 further includes a number of environmental sensors, each indicated at 52. The environmental sensors 52 may be configured to provide temperature and humidity data, which is used to monitor the ambient air temperature of the heat loads 48, and to compute the dew point of the environment in which the cooling modules 32 operate. The system 40 further includes a communication network 54, which provides a physical medium that the distribution unit 38, cooling modules 32, and sensors 52 use to communicate with each other.

Figure 3:
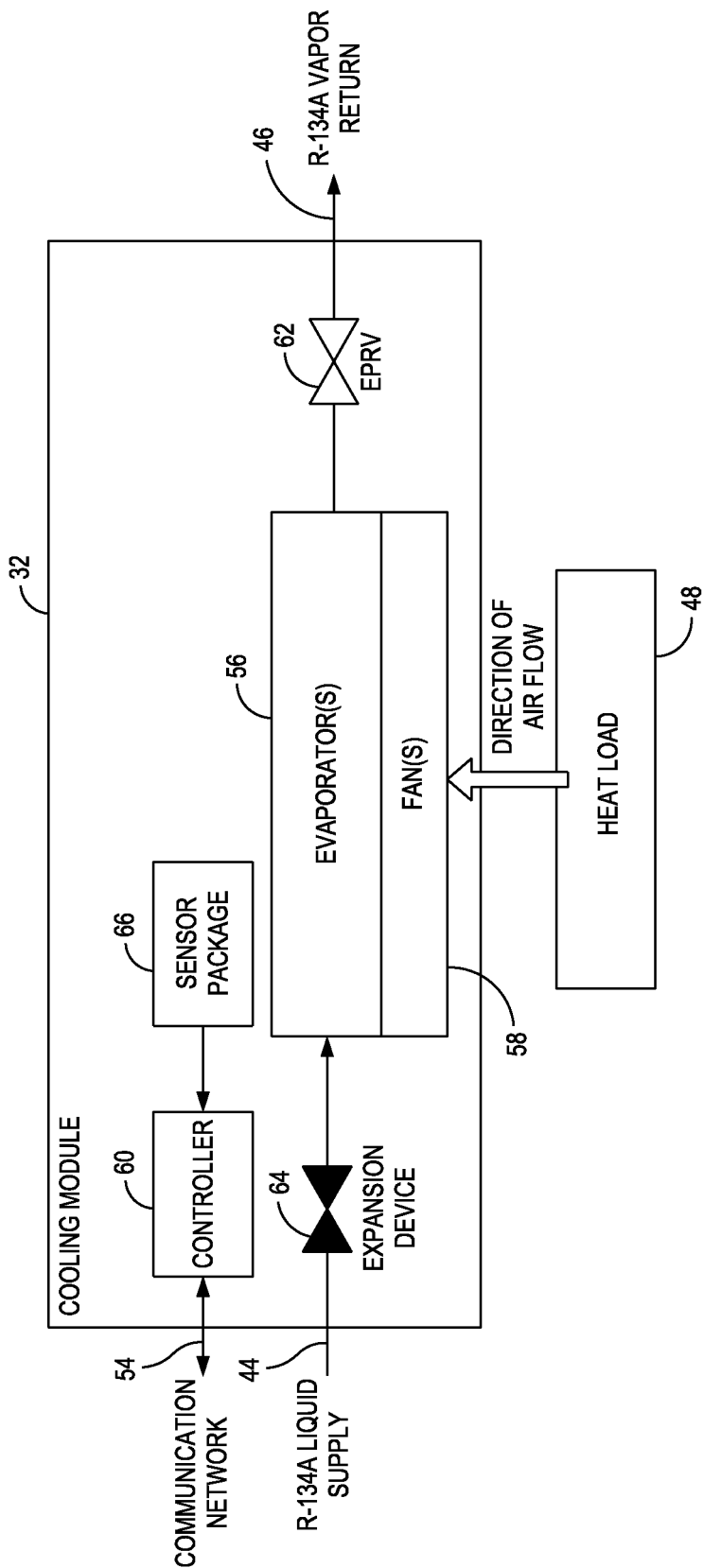
FIG. 3 is a block diagram of a cooling module of one embodiment of the cooling system shown in FIG. 2.

Turning now to FIG. 3, each cooling module 32 includes an evaporator 56, which is used to transfer heat from the IT equipment to the refrigerant travelling through the evaporator, and one or more fans 58, which are used to provide air flow across the evaporator. As shown, the fans 58 are configured to direct the heat load 48 (from the IT equipment contained within the equipment racks 18) toward the evaporator 56 for vaporizing refrigerant provided within the evaporator. Each cooling module 32 includes a controller 60 to control the operation of the cooling module. Specifically, in one embodiment, the controller 60 is a microprocessor-based device that is responsible for executing the operation, including the control or processing algorithms described herein, of the cooling module 32. In other embodiments, the controller 60 may be part of a master controller provided within the cooling system 40, or be part of a controller that communicates with a master controller of the management system's communication network.

Each cooling module 32 further includes an evaporator pressure regulator valve 62, which is used to control the saturation temperature of the refrigerant traveling through the evaporator 56, and an electronic expansion valve 64, which is used to maintain a proper super heat temperature at the exiting port of the evaporator. The cooling module 32 is further provided with a sensor package 66, which, in one embodiment, may include one or more of the following sensors: fan tachometers; return air thermometers; supply air thermometers; evaporator pressure sensors; and rack inlet thermometers. In other embodiments, the sensor package 66 may form part of the sensors 52 described in reference to system 40. As shown, the sensor package 66 communicates with the controller 60 to provide continuous feedback to the controller on the operational parameters of the cooling module 32. Based on the information obtained by the sensor package 66, the operation of the cooling module 32 may be controlled in the manner described below.

In certain embodiments, each fan 58 may be equipped with a tachometer that measures the speed of the fan. A separate control may be provided for controlling the speed of the fan 58. A return air thermometer measures the temperature of the air drawn into the evaporator 56. Some embodiments may include providing several thermometers, which are evenly distributed on the evaporator 56. The controller 60 is configured to use the average of these sensors as the return air temperature. The supply air thermometers measure the temperature of the air after it has passed through the evaporator 56. Some embodiments may include providing several sensors evenly distributed on the evaporator 56. As with the return air thermometers, the controller 60 is configured to use the average of these sensors as the supply air temperature. An evaporator pressure sensor measures the refrigerant pressure at the point where the refrigerant exits the evaporator 56. One or more rack inlet thermometer measures the temperature of IT equipment at the point where the equipment draws cool air.

The controller 60 may be configured to shut off the operation of the fans 58 to prevent hot air from being exhausted by the cooling module 32 in the case of a cooling system failure. The controller 60 may also be configured to shut of the operation of the cooling system in general when a catastrophic event occurs. For example, in the situation in which a leak of refrigerant is detected in the manner described below, an alarm 68 associated with the refrigerant distribution unit 38, may be triggered prior to shutting down the cooling system or certain component of the cooling system. The alarm 68 may be a visual alarm, an audible alarm, or both a visual/audible alarm.

In other embodiments, the cooling module may be scalable and modular, such as the cooling modules disclosed in U.S. patent application Ser. Nos. 11/335,874, 11/335,856 and 11/335,901 referenced above, or the cooling modules disclosed in U.S. patent application Ser. Nos. 11/504,370 and 11/504,382, each entitled COOLING SYSTEM AND METHOD and filed on Aug. 15 10, 2006, which are owned by the assignee of the present disclosure and incorporated herein by reference.

Figure 4:
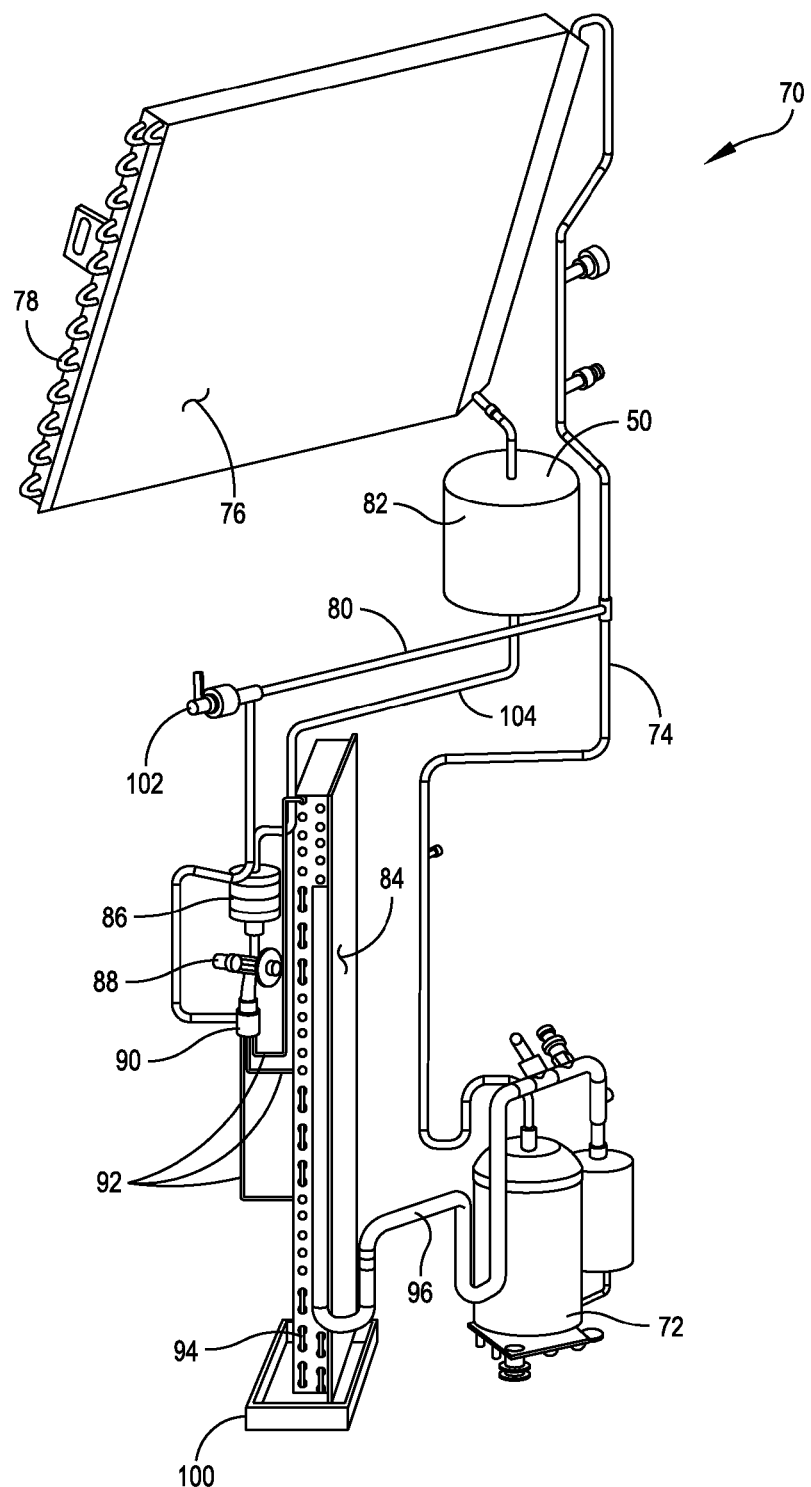
FIG. 4 is a perspective view of components of a cooling module of another embodiment of the disclosure.

For example, in another embodiment, which is shown in FIG. 4, a cooling module 70 includes a compressor 72 to deliver hot gas refrigerant under pressure to the components of the cooling module. The pressurized refrigerant travels through a discharge pipe 74, which connects the compressor 72 to a condenser 76. A temperature sensor and a pressure transducer may be provided adjacent to the condenser 76 to measure the temperature and the pressure of the refrigerant as it enters the condenser. A high pressure switch may be further provided to de-energize the compressor 76 thereby stopping the delivery of refrigerant to the condenser should the refrigerant experience an out of tolerance pressure condition that requires power to the compressor 72 to be cut off. The condenser 76 includes a coil 78 having thermally conductive fins configured to cool the heated refrigerant within the coil of the condenser. Once the refrigerant is cooled within the condenser 76 (e.g., transitioning the refrigerant from an evaporated state to a condensed state), the refrigerant travels through another liquid pipe 80 to a receiver 82, which collects the condensed refrigerant. A sensor 50 is disposed within the receiver 82 to measure the amount of refrigerant within the receiver. The receiver 82 is connected to an evaporator 84 by the pipe 80; however, prior to reaching the evaporator, the refrigerant first travels through a filter drier 86 to eliminate impurities and to remove unwanted non-condensables within the refrigerant. Once through the filter drier 86, the refrigerant travels through a thermal expansion valve 88 to condition the refrigerant prior to entering the evaporator 84.

Next, the low pressure refrigerant enters a distributor 90 and is distributed to the evaporator 84 by one of several (e.g., three) conduits, each indicated at 92 in FIG. 4. Once heated by warm air passing over coils 94 the evaporator 84, the evaporated refrigerant travels back to the compressor 72 via a section of suction piping 96. However, prior to entering the compressor 72, the refrigerant passes through a compressor suction accumulator 98, which ensures that refrigerant enters into the compressor in an evaporated state. Another temperature sensor and another pressure transducer may be provided adjacent to the compressor. A condensate pan 100 may be disposed below the evaporator to collect condensate generated by the evaporator.

The arrangement is such that high temperature refrigerant flows from the compressor 72 to the condenser 76. Pressure and temperature readings of the refrigerant are taken prior to the refrigerant entering the condenser 76. The condenser 76 cools the refrigerant by virtue of relatively cool air passing over the condenser coil 78. Once cooled, the refrigerant travels to the evaporator 84 via the receiver 82. A bypass valve 102 may be provided to divert refrigerant normally directed to the condenser 76 from the compressor 72 to the evaporator 84 via a discharge pipe 104. By opening the bypass valve 102, a portion of refrigerant traveling to the condenser 76 is diverted back to the evaporator 84 by way of the distributor 90. The operation of the bypass valve 102, which may sometimes be referred to as a hot gas bypass valve, may be manipulated to regulate the capacity of the cooling module 70. By closely monitoring the pressure and/or temperature of the refrigerant entering into the condenser 76, the efficiency of the cooling module 70 may be optimized by bypassing refrigerant that travels from the condenser to the evaporator 84.

Systems and methods of the present disclosure are directed to detecting a loss of refrigerant within a cooling system, such as the cooling systems described herein. In one embodiment, a method of detecting loss of refrigerant within a cooling system of the type having a condenser, a refrigerant receiver in fluid communication with the condenser, a sensor configured to detect a level of refrigerant within the receiver, an evaporator in fluid communication with the receiver, and a pump or compressor in fluid communication with the evaporator and the condenser, is disclosed. The method includes establishing a baseline measurement of refrigerant mass contained in the receiver during certain power loads applied to the cooling system. Once the baseline measurement is established, a mass of refrigerant in the receiver at a certain power load applied to the cooling system is monitored. A leak in the cooling system is identified when the monitored mass of refrigerant is less than the baseline measurement of refrigerant mass over a predetermined period of time.

In certain embodiments, cooling systems having one, two or four cooling modules are tested. The tests are used to establish data points for power versus refrigerant mass curves associated with each cooling system configuration in real time cooling capacity situations. In developing such systems and methods, certain requirements and assumptions are made. For example, one requirement is that the system and method shall be able to detect a leak of refrigerant within a cooling system as fast as ten pounds (10 lbs) of refrigerant per hour within twenty minutes. Another requirement is that the system and method shall be able to detect a leak of refrigerant within a cooling system as slow as one pound (1 lb) of refrigerant per year within one year. The examples disclosed herein are limited to values obtained from certain types of systems having certain capacity limits.

One assumption is that a power versus refrigerant mass curve, which will be described in greater detail below, is valid when the distribution unit or the condenser is pushing refrigerant (e.g., R-134a, $CO_2$, R-407c or R-410a). Another assumption is that the power versus refrigerant mass curve may not operate for heat loads over 80 kW. Yet another assumption is that the power versus refrigerant mass curve may not be valid or otherwise operate for loads under 10 kW. Another assumption is that the shape of the power versus refrigerant mass curve is consistent for cooling systems having differing numbers of cooling modules, but with the same types of cooling modules. As referred to above, the systems and methods developed herein employ a varying amount of cooling modules (e.g., four, two and one) to establish data points during real time operation of the cooling modules. And finally, it is assumed that the refrigerant level is measured in the receiver when the refrigerant distribution unit or the cooling module is in idle mode.

Prior to establishing a baseline measurement of refrigerant within the receiver of the cooling system, a startup of the cooling system is initiated with a constant load being applied on the cooling system. To initiate the process, a baseline measurement of refrigerant mass contained within the receiver is obtained by determining a level of refrigerant in the receiver with the sensor provided within the receiver. The sensor is configured to send data to the controller of the system to determine a ratio of the amount of refrigerant in the receiver with respect to a volume of the receiver. The level of refrigerant in the receiver is converted to mass using Equation 1.

$$R_M = -0.2342 \times (0.08 R_L)^3 + 3.0394 \times (0.08 R_L)^2 + 6.024 \times (0.08 R_L) - 1.267 \quad (1)$$

where $R_M$—mass of refrigerant (R-134a) at 52° F. in pounds (lbs); and $R_L$—the ratio of the amount of refrigerant in the receiver.

It should be noted that Equation 1 assumes that the temperature of the refrigerant in the receiver is 52° F. It is also assumed that an error in the calculation of the refrigerant mass due to temperature differences in the refrigerant is negligible over the intended operating range of the particular embodiment.

As discussed, the power versus mass refrigerant curve may be derived for systems having one, two, four and six cooling modules. After initiating the cooling system, the heat loads applied to the cooling modules are stepped from 0 kW to 80 kW in 10 kW steps. Approximately 45 minutes of real time data are obtained for each load setting, with data obtained from the sensor provided in the receiver at one second intervals. The recorded data points are: (1) output power ($P_{OUT}$) in kilowatts (kW) of each cooling module; and (2) refrigerant level in the receiver as a percentage of capacity of refrigerant in the receiver ($R_L$) from zero to 100 percent.

As mentioned above, the refrigerant mass ($R_M$) is calculated for each ratio of the amount of refrigerant ($R_L$) using Equation 1. The output power ($P_{OUT}$) and mass of refrigerant ($R_M$) data points are then filtered with a first order infinite input response ("IIR") low pass filter identified in Equation 2.

$$y(n) = 0.995 y(n-1) + 0.005 x(n); (f_s = 1 \text{ Hz}; \ldots f_c = 0.0008 \text{ Hz}) \quad (2)$$

$P_{OUTF}$ defines the filtered output power ($P_{OUT}$) and $R_{MF}$ describes the filtered values of the mass of refrigerant ($R_M$).

The filtered output power ($P_{OUTF}$) and the filtered mass of refrigerant ($R_{MF}$) are concatenated into a table where the rows designate a sample time and the columns contain the filtered output power ($P_{OUTF}$) and the filtered mass of refrigerant ($R_{MF}$). The table is sorted based on the filtered output power ($P_{OUTF}$) into increasing values of filtered output power ($P_{OUTF}$). The sorted table is then analyzed to create a reduced table, which averages the values of filtered mass of refrigerant ($R_{MF}$) that are within 1 kW of a filtered output power ($P_{OUTF}$). The following MATLAB™ function is used to create a reduced data set defined as follows:

function[Y,Status]=AveragedDataSet(X)

AveragedDataSet accepts a two dimensional matrix sorted on the first column and replaces a sequence of repeated elements with one occurrence of the element, in the first column of Y, along with the average value of the values of X corresponding to the repeated element in the second column of Y.

```
if ndims(X) ~= 2
    Status = false;
    return;
end.
InputDim= size(X);
Length = InputDim(1);
j = 1;
k = 1;
while j <= Length;
    Sum = 0;
    NumVals = 0;
    CurrentVal = X(j, 1); % get the first value of X from column 1;
    CurrentIndex = j;
    while (j <= Length) && (X(j, 1) <= (CurrentVal + 1));
        Sum = Sum + X(j, 2); % Sum the value of the second column;
        NumVals = NumVals + 1;
        j = j + 1;
    end.
    Y(k,(1:2)) = [CurrentVal, Sum / NumVals];
    k = k + 1;
end.
Status = true.
```

Figure 5:
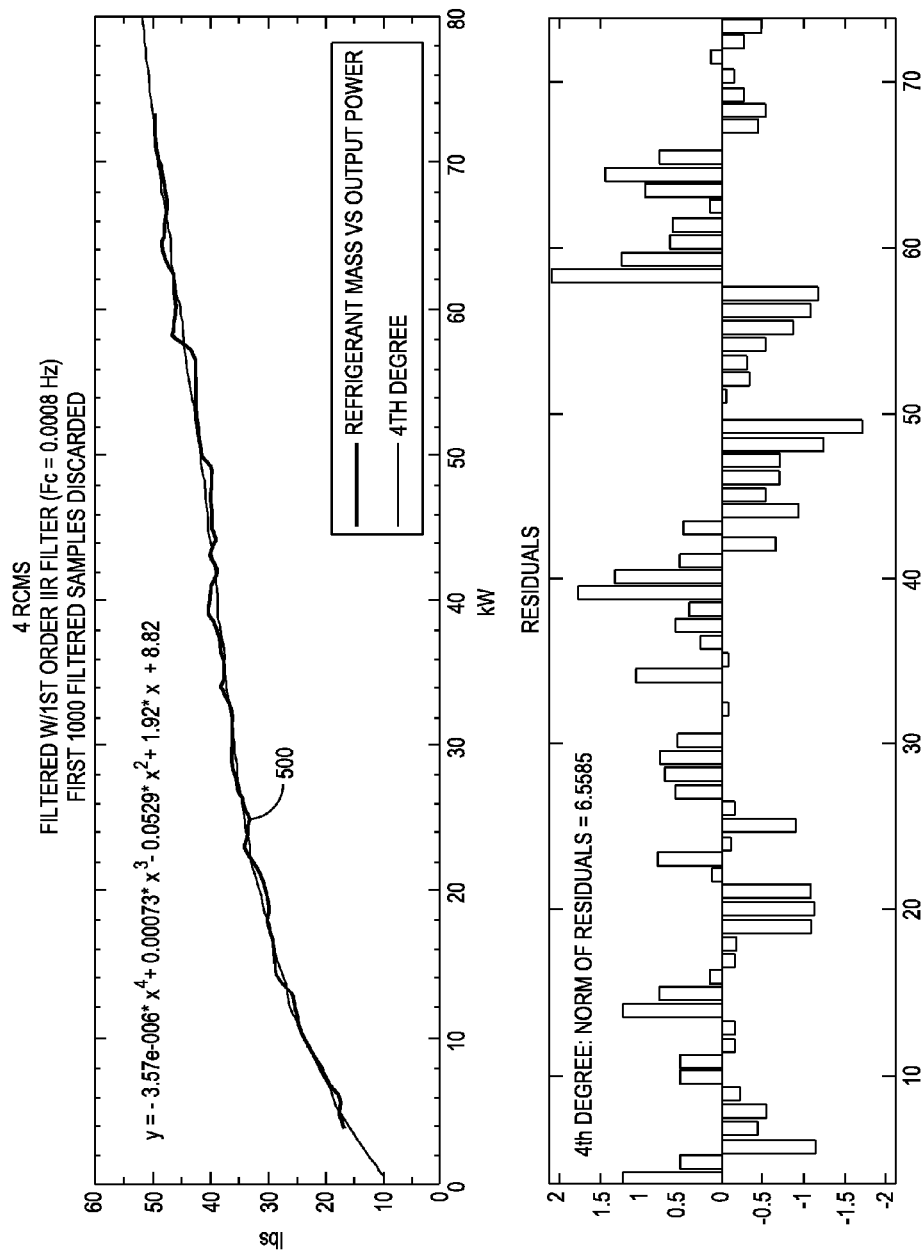
FIG. 5 is a graph representing refrigerant mass versus output power for four cooling modules.

$P_{OUTR}$ defines the filtered reduced values of the output power $P_{OUT}$ and $R_{MR}$ describes the filtered and reduced values of the mass of refrigerant $R_M$. The filtered reduced value of the output power ($P_{OUTR}$) as an independent variable is then plotted against the filtered and reduced values of the mass of refrigerant ($R_{MR}$). As shown in FIG. 5, a curve 500 is fitted to a result, which represents the data collected for the four cooling module system. Similarly, the filtered reduced values of the output power ($P_{OUTR}$) and the mass of refrigerant ($R_{MR}$) is plotted for the data collected for the two cooling module system to produce curve 600, which is shown in FIG. 6, and for the data collected for the one cooling module system to produce curve 700, which is shown in FIG. 7.

Figure 6:
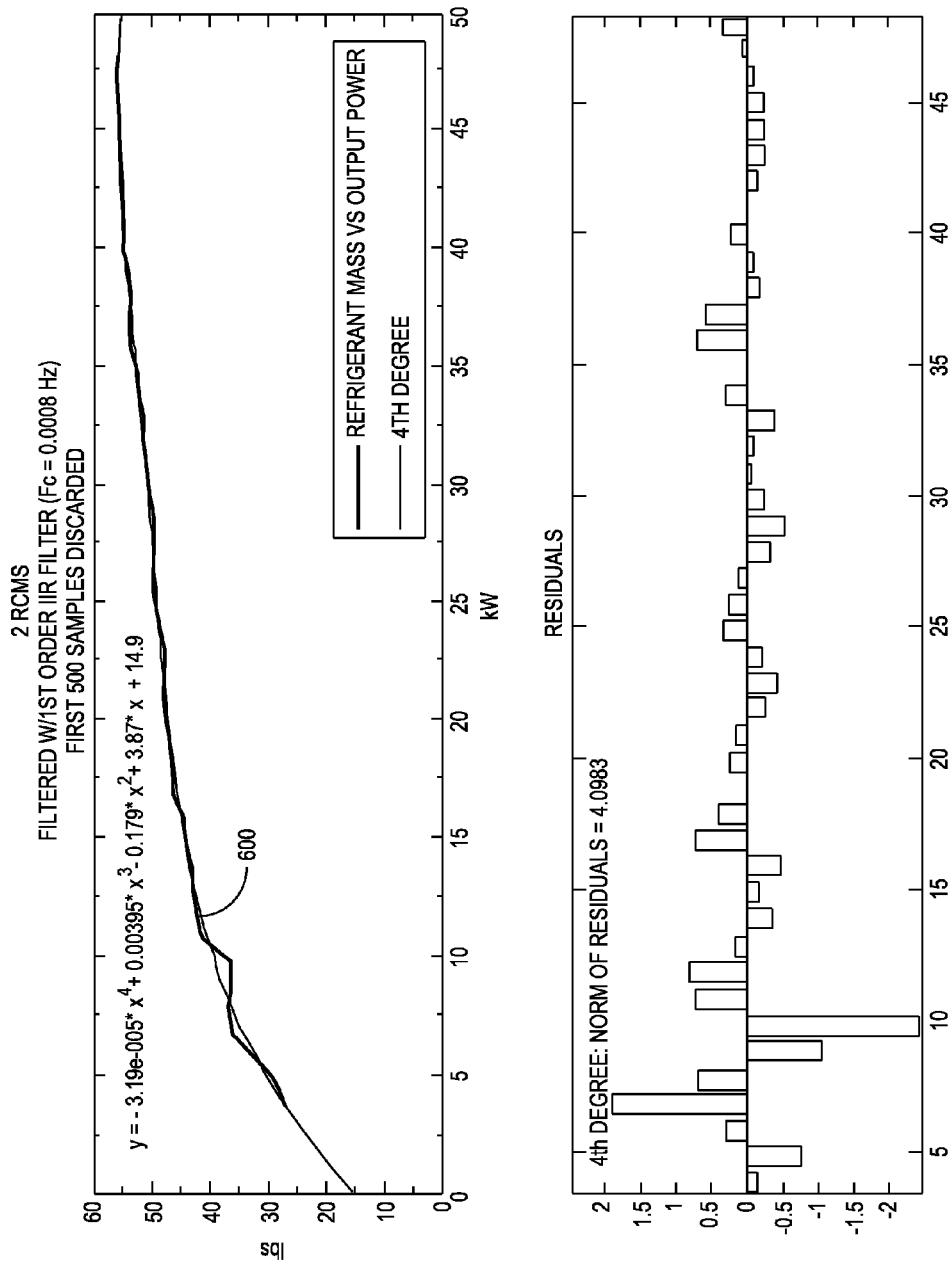
FIG. 6 is a graph representing refrigerant mass versus output power for two cooling modules.
Figure 7:
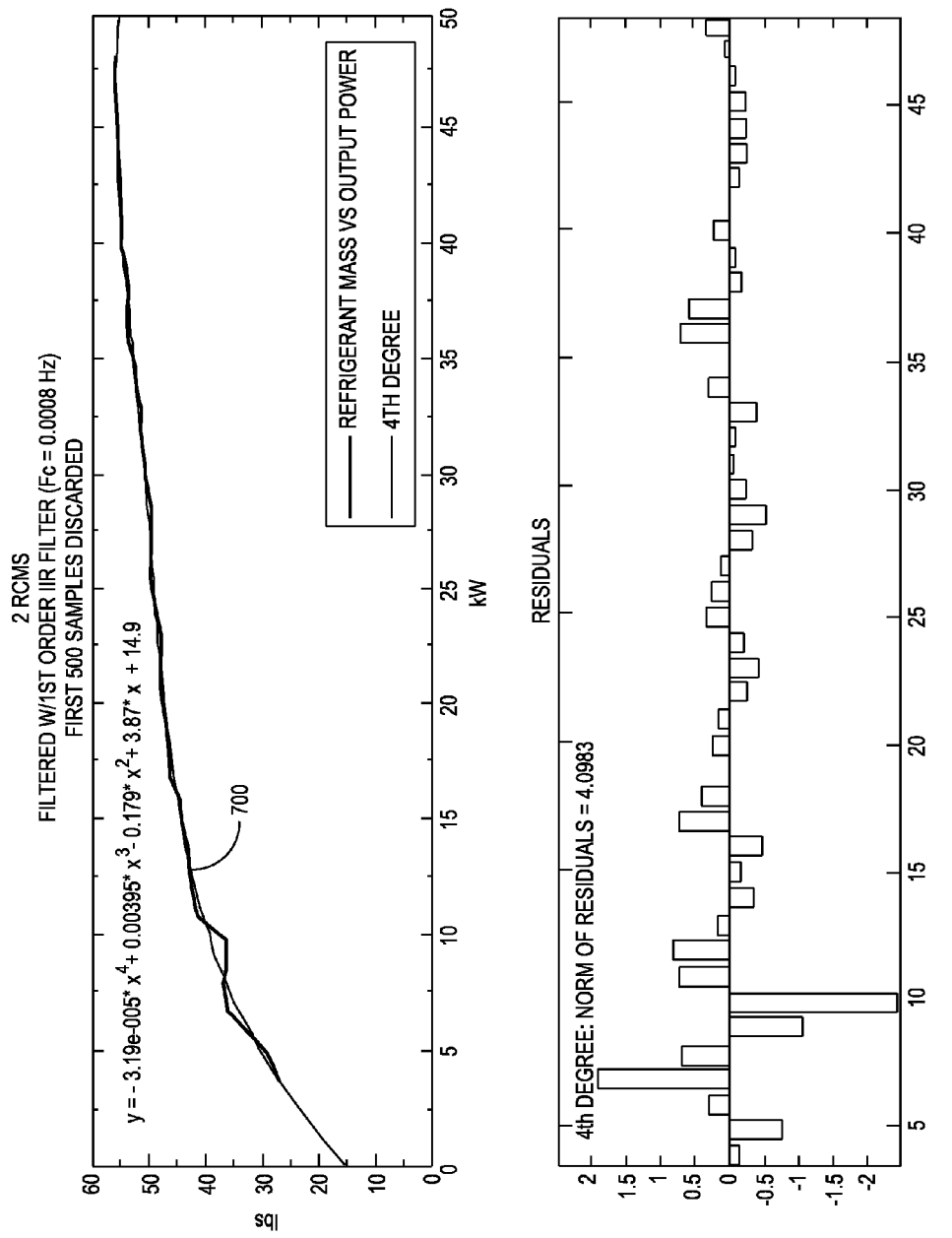
FIG. 7 is a graph representing refrigerant mass versus output power for one cooling modules.

As shown in FIGS. 5-7, the curves 500, 600 and 700, respectively, all appear to be the same general shape. By selecting a curve and by adjusting a Y-intercept C, as necessary, for a given set of initial conditions, a data set consisting of points ($P_{OUT}$ and $R_{MR}$) is provided. By choosing any pair of points in the set and solving the equation for C, a curve from a set of all possible curves is provided. For example, if the curve for the data of the four cooling modules is selected, by employing Equation 3, the results are as follows:

$$R_M = -0.000003571 P_{out}^4 + 0.00072977 P_{out}^3 - 0.052869 P_{out}^2 + 1.92 P_{out} + C \quad (3)$$

Next, a single point out of the data set is placed into Equation 4 to solve for C. Thus, a specific curve from the set of all possible curves is obtained.

$$C = R_M \cdot (-0.000003571 P_{out}^4 + 0.00072977 P_{out}^3 - 0.052869 P_{out}^2 + 1.92 P_{out}) \quad (4)$$

In one embodiment, the curve 500 provided for the real time data collected from the four cooling modules is selected since the curve covers a greatest range of power. The other curves 600, 700, while providing acceptable results, may not provide an accurate prediction when applied to powers outside of a range of which the data was obtained. This suggests, when using curves for a lesser amount of cooling modules, that the particular curve must be re-calculated for the production system which can support a larger power range.

A process for detecting refrigerant loss may include obtaining a Y-intercept C. This step may be performed during the commissioning of the cooling system, or whenever refrigerant is added or removed from the system, or when cooling modules are added or removed from the cooling system. When one of these events occurs, an active cooling module is placed into a standby mode.

The method of obtaining a Y-intercept C includes initiating the system, applying a constant load of at least 10 kW, and waiting for a start-up transient, if any, to dissipate (e.g., about 20 minutes). For heat loads less the 10 kW the curve may not produce accurate results.

The system further includes measuring and filtering the output power ($P_{OUT}$) and the ratio of refrigerant ($R_L$) by using Equation 5 for one minute intervals for thirty minutes.

$$y(n) = 0.9765625 y(n-1) + 0.0234375 x(n); (f_s = 0.2 \text{ Hz}, f_c = 0.000753165 \text{ Hz}) \quad (5)$$

Next, referring back to Equation 1, a mass of refrigerant may be calculated. After, the Y-intercept C, is calculated by using the filtered values of output power ($P_{OUT}$) and the mass of refrigerant ($R_M$) by using Equation 4. The value of C may be stored non-volatile memory.

The process for detecting refrigerant loss may further include monitoring refrigerant mass during the operation of the cooling system by waiting a predetermined period of time, e.g., at least twenty minutes after system start up, so that any startup transient conditions are removed. The receiver has a known geometry and the refrigerant has a known or assumed density. By observing the height of refrigerant in the receiver, for example, a volume of refrigerant may be calculated against the known volume of the receiver. By determining the volume of refrigerant within the receiver, the mass of the refrigerant may be calculated by applying the product of the density of the refrigerant and its volume.

As mentioned above, the output power should be greater than 10 kW. By using Equation 1, the mass of refrigerant may be calculated. By using Equation 5, the measured and filtered output power and refrigerant mass may be calculated. By using the output power and Equation 3, a predicted refrigerant mass ($R_{MP}$) may be calculated. An average of the refrigerant mass ($\Delta R$) is achieved by subtracting the refrigerant mass ($R_M$) from the predicted mass ($R_{MP}$), which is represented in Equation 6.

$$\Delta R = R_{MP} - R_M \quad (6)$$

If the average of the refrigerant mass ($\Delta R$) exceeds a predetermined mass amount (e.g., five pounds) for a predetermined period time ($t_F$) as specified in Equation 7, then a warning is generated. This sequence is repeated at one minute intervals.

$$t_F = \frac{A_{SENS} \text{lb} * \text{min}}{\Delta R - 5 \text{ lbs}} \quad (7)$$

where ASENS is the lb X min threshold; and
by default, lb*min is 10/6 lbs-min.

Different operation of the cooling modules may result in changes made to the power versus mass refrigerant curves. For example, data samples may be collected from cooling modules configured to operate at a certain set point. The Y-intercept C result might change when the set point changes. If this change occurs, then it must be accounted for when mapping the power versus mass refrigerant curve.

It should be understood that the controller of the cooling system may be configured to perform the process steps for detecting refrigerant leaks within the cooling systems disclosed herein. A dedicated controller or processor may also be provided to perform this function.

Thus, it should be observed that systems and methods of determining a set of system variables that affect the mass of refrigerant in the receiver are provided. The systems and methods develop a profile of how the mass of the refrigerant in the receiver is affected by changes in the system variables over the operating range of the system and over a period of time. The profile is programmed in a controller or some other microprocessor associated with the cooling system. The arrangement is such that during the setup of the cooling system, after the system has been charged with refrigerant, the controller obtains a baseline of mass of refrigerant within the receiver after conducting real time data. During the operation of the cooling system, the controller continues to monitor the mass of the refrigerant within the receiver and to compare the mass of refrigerant to the baseline of mass of refrigerant by using the profile. If the mass of refrigerant in the receiver is less than what is expected, as shown above, then the controller indicates this to an operator of the cooling system by an alarm, such as alarm 68. In other embodiments, the indication of a detection leak may be generated through one or more displays associated with the controller of the cooling system.

It should be understood that while systems and methods of detecting refrigerant leaks within cooling systems are disclosed with respect to the specific cooling systems disclosed herein, the principles of this disclosure may be applied to other cooling systems as well in which identifying such leaks is important to the operator.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A method of detecting loss of refrigerant within a cooling system of the type having a condenser, a refrigerant receiver in fluid communication with the condenser, a sensor configured to detect a level of refrigerant within the receiver, an evaporator in fluid communication with the receiver, and a pump or compressor in fluid communication with the evaporator and the condenser, the method comprising:

establishing a plurality of baseline measurements of refrigerant mass contained in the receiver during a plurality of power loads applied to the cooling system for a plurality of cooling system configurations;

generating a curve of refrigerant mass versus power for the cooling system for each of the plurality of cooling system configurations, in response to establishing the plurality of baseline measurements of refrigerant mass contained in the receiver during the plurality of power loads applied to the cooling system for the plurality of cooling system configurations;

selecting a curve of refrigerant mass versus power for the cooling system associated with a cooling system configuration;

adjusting a Y-intercept corresponding to the selected curve of refrigerant mass versus power based on a set of initial conditions of the cooling system;

monitoring a mass of refrigerant in the receiver at a certain power load applied to the cooling system;

determining a respective baseline measurement of refrigerant mass for the certain power load from the selected curve of refrigerant mass versus power; and identifying whether the monitored mass of refrigerant is less than the respective baseline measurement of refrigerant mass over a predetermined period of time.

2. The method of claim 1, wherein establishing a baseline measurement of the plurality of baseline measurements of refrigerant mass includes initiating a startup of the cooling system and applying a constant load on the cooling system.

3. The method of claim 2, wherein establishing the baseline measurement of the plurality of baseline measurements of refrigerant mass further includes obtaining data from the sensor to determine a volume of the refrigerant in the receiver, and wherein the mass of the refrigerant within the receiver is calculated by using the volume of the refrigerant in the receiver.

4. The method of claim 1, wherein monitoring the mass of refrigerant in the receiver includes continuously obtaining data from the sensor in the receiver to determine a volume of refrigerant in the receiver.

5. The method of claim 1, further comprising generating an alarm when the monitored mass of refrigerant at the certain power load is less than the respective baseline measurement of refrigerant mass for the certain power load over the predetermined period of time.

6. The method of claim 5, wherein the method is continuously repeated after predetermined time intervals.

7. The method of claim 1, wherein generating the curve of refrigerant mass versus power includes obtaining a Y-intercept corresponding to the curve of refrigerant mass versus power based on a set of initial conditions of the cooling system.

8. The method of claim 7, wherein obtaining the Y-intercept includes initiating a startup of the cooling system and applying a constant load of at least 10 kW on the cooling system and wherein determining the respective baseline measurement of refrigerant mass for the certain power load from the curve of refrigerant mass versus power further includes determining the respective baseline measurement based on the Y-intercept.

9. A system of detecting loss of refrigerant within a cooling system of the type having a condenser, a refrigerant receiver in fluid communication with the condenser, a sensor configured to detect a level of refrigerant within the receiver, an evaporator in fluid communication with the receiver, and a pump or compressor in fluid communication with the evaporator and the condenser, the system comprising:

a controller configured to
establish a plurality of baseline measurements of refrigerant mass contained in the receiver during a plurality of power loads applied to the cooling system for a plurality of cooling system configurations, generate a curve of refrigerant mass versus power for the cooling system for each of the plurality of cooling system configurations, in response to establishing the plurality of baseline measurements of refrigerant mass contained in the receiver during the plurality of power loads applied to the cooling system for the plurality of cooling system configurations, select a curve of refrigerant mass versus power for the cooling system associated with a cooling system configuration, adjust a Y-intercept corresponding to the selected curve of refrigerant mass versus power based on a set of initial conditions of the cooling system, monitor a mass of refrigerant in the receiver at a certain power load applied to the cooling system, determine a respective baseline measurement of refrigerant mass for the certain power load from the selected curve of refrigerant mass versus power, and identify whether the monitored mass of refrigerant is less than the respective baseline measurement of refrigerant mass over a predetermined period of time.

10. The system of claim 9, wherein the controller, when establishing a baseline measurement of the plurality of baseline measurements of refrigerant mass, is configured to initiate a startup of the cooling system and apply a constant load on the cooling system.

11. The system of claim 10, wherein the controller, when establishing the baseline measurement of the plurality of baseline measurements of refrigerant mass, is configured to obtain data from the sensor in the receiver to determine a volume of the refrigerant in the receiver, and wherein the mass of the refrigerant within the receiver is calculated by using the volume of the refrigerant in the receiver.

12. The system of claim 9, wherein the controller, when monitoring the mass of refrigerant in the receiver, is configured to identify a level of refrigerant in the receiver.

13. The system of claim 9, wherein the controller, when monitoring the mass of refrigerant in the receiver, is configured to continuously obtain data for a volume of refrigerant in the receiver.

14. The system of claim 9, further comprising an alarm coupled to the controller, the alarm being triggered when the monitored mass of refrigerant at the certain power load is less than the respective baseline measurement of refrigerant mass for the certain power load over the predetermined period of time.

15. A cooling system comprising:
a condenser;
a refrigerant receiver in fluid communication with the condenser;
a sensor configured to detect a level of refrigerant within the receiver;
an evaporator in fluid communication with the receiver;
a pump or compressor in fluid communication with the evaporator and the condenser; and
a controller configured to
establish a plurality of baseline measurements of refrigerant mass contained in the receiver during a plurality of power loads applied to the cooling system for a plurality of cooling system configurations, generate a curve of refrigerant mass versus power for the cooling system for each of the plurality of cooling system configurations, in response to establishing the plurality of baseline measurements of refrigerant mass contained in the receiver during the plurality of power loads applied to the cooling system for the plurality of cooling system configurations, select a curve of refrigerant mass versus power for the cooling system associated with a cooling system configuration, adjust a Y-intercept corresponding to the selected curve of refrigerant mass versus power based on a set of initial conditions of the cooling system, monitor a mass of refrigerant in the receiver at a certain power load applied to the cooling system, determine a respective baseline measurement of refrigerant mass for the certain power load from the selected curve of refrigerant mass versus power, and identify whether the monitored mass of refrigerant is less than the respective baseline measurement of refrigerant mass over a predetermined period of time.

16. The cooling system of claim 15, wherein the controller, when establishing a baseline measurement of the plurality of baseline measurements of refrigerant mass, is configured to initiate a startup of the cooling system and apply a constant load on the cooling system.

17. The cooling system of claim 16, wherein the controller, when establishing the baseline measurement of the plurality of baseline measurements of refrigerant mass, is configured to obtain data from the sensor in the receiver to determine a volume of the refrigerant in the receiver, and wherein the mass of the refrigerant within the receiver is calculated by using the volume of the refrigerant in the receiver.

18. The cooling system of claim 15, wherein the controller, when monitoring the mass of refrigerant in the receiver, is configured to identify a level of refrigerant in the receiver.

19. The cooling system of claim 15, wherein the controller, when monitoring the mass of refrigerant in the receiver, is configured to continuously obtain data for a volume of the amount of refrigerant in the receiver.

20. The cooling system of claim 15, further comprising an alarm coupled to the controller, the alarm being triggered when the monitored mass of refrigerant at a certain power load is less than the respective baseline measurement of refrigerant mass for the certain power load over the predetermined period of time.

* * * * *